United States Patent
Hinkle et al.

(10) Patent No.: US 9,054,632 B2
(45) Date of Patent: Jun. 9, 2015

(54) IN-PROCESS ELECTRICAL CONNECTOR

(75) Inventors: James Hinkle, Lambertville, MI (US);
Imran Khan, Perrysburg, OH (US);
Modesto Sanchez, Perrysburg, OH (US); Thomas Truman, Toledo, OH (US)

(73) Assignee: First Solar, Inc., Perrysburg, OH (US)

( * ) Notice: Subject to any disclaimer, the term of this patent is extended or adjusted under 35 U.S.C. 154(b) by 702 days.

(21) Appl. No.: 13/198,256

(22) Filed: Aug. 4, 2011

(65) Prior Publication Data
US 2012/0032694 A1 Feb. 9, 2012

Related U.S. Application Data

(60) Provisional application No. 61/371,518, filed on Aug. 6, 2010.

(51) Int. Cl.
| | | |
|---|---|---|
| *G01R 31/26* | (2014.01) | |
| *H02S 50/10* | (2014.01) | |
| *G01R 1/073* | (2006.01) | |

(52) U.S. Cl.
CPC ............ *H02S 50/10* (2014.12); *G01R 1/07342* (2013.01)

(58) Field of Classification Search
None
See application file for complete search history.

(56) References Cited

U.S. PATENT DOCUMENTS

| | | |
|---|---|---|
| 2,250,458 A | 7/1941 | Barnes |
| 3,327,206 A | 6/1967 | Wood |
| 3,523,241 A | 8/1970 | Barton |
| 3,593,120 A | 7/1971 | Mandula et al. |
| 4,004,843 A | 1/1977 | Boenning et al. |
| 4,543,528 A | 9/1985 | Baraona |
| 4,668,041 A | 5/1987 | La Komski et al. |
| 5,313,016 A | 5/1994 | Brusati et al. |
| 5,825,192 A | 10/1998 | Hagihara |
| 6,218,846 B1 * | 4/2001 | Ludwig et al. ................ 324/713 |
| 6,426,638 B1 | 7/2002 | Di Stefano |
| 6,547,607 B2 | 4/2003 | Moll et al. |
| 6,552,523 B2 * | 4/2003 | Huard ......................... 324/72.5 |
| 6,724,203 B1 | 4/2004 | Goldmann et al. |
| 6,917,525 B2 | 7/2005 | Mok et al. |
| 7,134,909 B2 | 11/2006 | Baba et al. |

(Continued)

OTHER PUBLICATIONS del Cueto, J. A., et al. "Striving for a Standard Protocol for Preconditioning or Stabilization of Polycrystalline Thin Film Photovoltaic Modules", Jul. 2009, National Renewable Energy Laboratory (NREL), Preprint. No. NREL/CP-520-44935, pp. 1-12).*

(Continued)

*Primary Examiner* — Melissa Koval
*Assistant Examiner* — Stephen G Armstrong
(74) *Attorney, Agent, or Firm* — Dickstein Shapiro LLP

(57) ABSTRACT

Characteristics of partially assembled photovoltaic modules can be determined using electrical connection apparatuses and methods. By providing deformable electrical contacts against a partially assembled module on an assembly line, an electrical bias can be applied to the module before the module is completely assembled. An electrical connection apparatus for a photovoltaic module may include a first contact configured to engage a first lead on the photovoltaic module, a second contact configured to engage a second lead on the photovoltaic module, and an electrical power source configured to apply an electrical bias between the first contact and the second contact.

31 Claims, 7 Drawing Sheets

(56) References Cited

U.S. PATENT DOCUMENTS

| | | | |
|---|---|---|---|
| 7,518,386 | B2 | 4/2009 | Watanabe |
| 7,934,945 | B2 | 5/2011 | Narita et al. |
| 2003/0122558 | A1 | 7/2003 | Hacke |
| 2004/0046579 | A1 | 3/2004 | Chraft et al. |
| 2005/0257823 | A1 | 11/2005 | Zwanenburg |
| 2006/0279301 | A1* | 12/2006 | Treibergs ............... 324/754 |
| 2007/0063715 | A1 | 3/2007 | Cannon et al. |
| 2009/0014061 | A1* | 1/2009 | Harris et al. ............ 136/255 |
| 2009/0134895 | A1* | 5/2009 | Miller ..................... 324/758 |
| 2010/0045264 | A1 | 2/2010 | Kiesewetter et al. |
| 2011/0062980 | A1 | 3/2011 | Wu |

OTHER PUBLICATIONS

Keithley Inc., "Electrical Characterization of Photovoltaic Materials and Solar Cells with the Model 4200-SCS Semiconductor Characterization System", KEITHLY Application Note Series, Jun. 2, 2010, pp. 1-15, No. 3026.

Stauffer L., "Fundamentals of Semiconductor C-V Measurements", EE Evaluation Engineering, Dec. 1, 2008, pp. 20-24, vol. 47, No. 12.

S. Ashok et al., "Photovoltaic Measurements", Solar Cells, Apr. 1, 1985, pp. 61-81, vol. 14, No. 1.

* cited by examiner

US 9,054,632 B2

IN-PROCESS ELECTRICAL CONNECTOR

CROSS-REFERENCE TO RELATED APPLICATION

This application claims priority to provisional application 61/371,518, filed Aug. 6, 2010, which is incorporated by reference herein in its entirety.

TECHNICAL FIELD

The present invention relates to manufacturing and testing photovoltaic modules and methods for manufacturing and testing photovoltaic modules.

BACKGROUND

When manufacturing a solar module, electrical contacts are often added to the solar module near the end of the manufacturing process. Unfortunately, the solar module cannot be electrically biased until the electrical contacts are added. As a result, applications requiring electrical bias cannot be performed until late in the process.

BRIEF DESCRIPTION OF THE INVENTION

Figure 1:
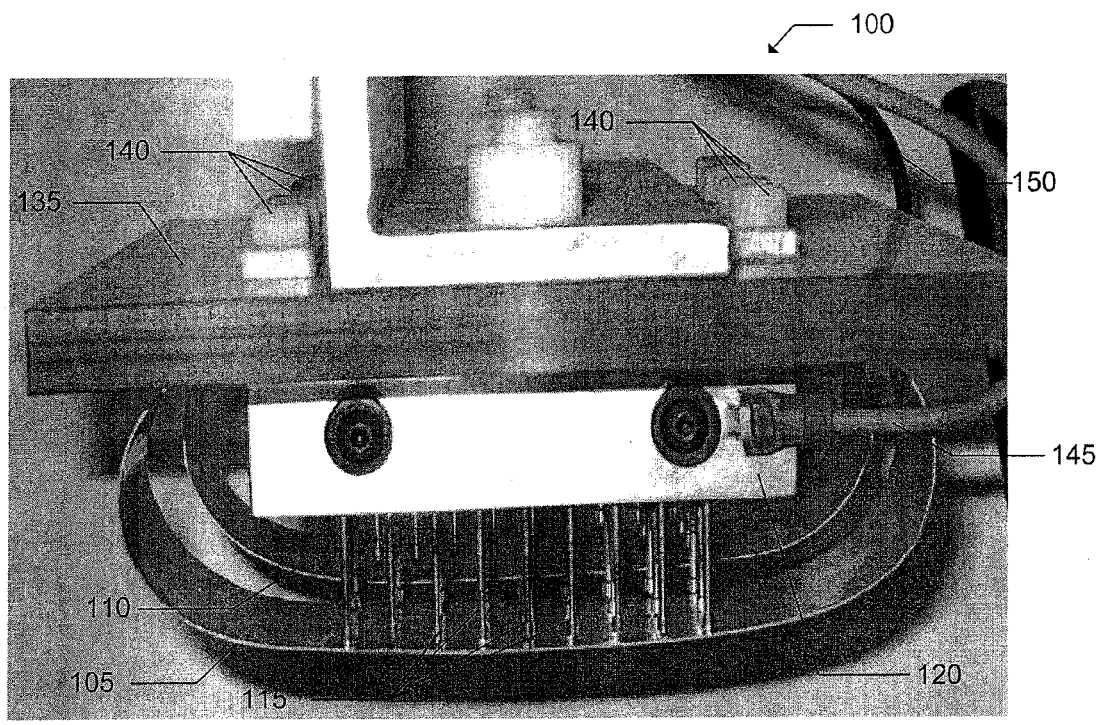
FIG. 1 is a perspective view of an electrical connection apparatus for a photovoltaic module.

To overcome the problem of being unable to apply an electrical bias to the module before electrical contacts are installed, an apparatus and a method for introducing temporary electrical contacts are set forth herein. By providing temporary electrical contacts against partially assembled module on an assembly line, an electrical bias can be applied to the module before the module is completely assembled. For example, as part of the manufacturing process, it can be desirable to apply an electrical bias to the photovoltaic module. This biasing can occur at any suitable step during the photovoltaic module manufacture and can be carried out for any suitable reason, such as to precondition the photovoltaic module.

The availability of temporary electrical contacts can also allow for any other suitable electrical connection. For example, temporary electrical contacts can allow for performance evaluation. For instance, it may be desirable to determine characteristics of the semiconductor layers such as depletion width, doping density, film layer thickness, trap concentrations, and absorber thickness. It may also be desirable to determine free carrier versus deep trap contributions. To guarantee that each module conforms to product specifications, an in-process method of testing the modules may be used. The modules may be tested at any point during the manufacturing process.

Near the end of a manufacturing process, a cord plate is commonly attached to a protective back substrate on a photovoltaic module. The cord plate allows for electrical connection of the module in the field and also provides electrical leads to test the module's performance. However, before the cord plate is installed, a first and second lead may be exposed near the protective back substrate. By developing a new in-process electrical connection apparatus, the performance of the module can be assessed by contacting those exposed leads. As a result, steps to improve the module can be taken prior to its completion. Similarly, if the module is defective, the module can be removed from the assembly line before additional resources are devoted to its manufacture.

DETAILED DESCRIPTION

In one aspect, an electrical connection apparatus for a photovoltaic module may include a first contact configured to engage a first lead on the photovoltaic module, a second contact configured to engage a second lead on the photovoltaic module, and an electrical power source configured to apply an electrical bias between the first contact and the second contact. The electrical bias may have a voltage ranging from 5 mV to 300 V. The electrical bias may have a constant voltage or a pulsed voltage. The electrical bias may have a current ranging from 0.1 Amps to 30 Amps. The electrical bias may have a constant current or a pulsed current. The electrical bias has a frequency ranging from 0 Hz to 100 MHz.

The first contact may be deformable, and the second contact may be deformable. The first contact may include metal foil, and the second contact may include metal foil. The apparatus may include an insulating platform comprising a top side and bottom side. Also, the apparatus may include a first conductive block fastened to the bottom side of the insulating platform where the first contact may be attached to the first conductive block. The apparatus may include a second conductive block fastened to the bottom side of the insulating platform, where the second contact may be attached to the second conductive block. The first conductive block may be fastened to the bottom side of the insulating platform with insulating fasteners, and the second conductive block may be fastened to the bottom side of the insulating platform with insulating fasteners. The insulating fasteners may include a fluorinated polymer.

The apparatus may include a first plurality of adjustable contacts extending from the first conductive block to the first contact. The first plurality of adjustable contacts may be spring contacts. Similarly, the apparatus may include a second plurality of adjustable contacts extending from the second conductive block to the second contact. The second plurality of adjustable contacts may be spring contacts.

In another aspect, a method for manufacturing a photovoltaic module may include providing a partially assembled photovoltaic module comprising a surface, conforming a first contact to the surface to form a first temporary conductive path between the first contact and the photovoltaic module, and conforming a second contact to the surface to form a second temporary conductive path between the second contact and the photovoltaic module. The method can include applying an electrical bias to the partially assembled photovoltaic module via the first and second temporary contacts. The method can include applying an electrical bias to one or more photovoltaic devices in the partially assembled photovoltaic module via the first and second temporary contacts. The bias can include a preconditioning bias. The method can include testing a characteristic of the partially assembled photovoltaic module via the first and second temporary contacts. The electrical bias may have a voltage ranging from 5 mV to 300 V. The electrical bias may have a constant voltage. The electrical bias may have a pulsed voltage. The electrical bias may have a current ranging from 0.1 Amps to 30 Amps. The electrical bias may have a constant current. The electrical bias may have a pulsed current. The electrical bias may have a frequency ranging from 0 Hz to 100 MHz. The electrical bias may be applied for a duration of about 1 ms to about 30 minutes, or about 1 ms to about 20 minutes, or about 1 ms to about 10 min, or about 1 ms to about 5 minutes, or about 1 ms to about 1 minute, or about 1 ms to about 15 seconds, or about 1 ms to about 5 seconds, or about 20 minutes to about 30 minutes, or about 10 minutes to about 20 minutes, or about 5 minutes to about 15 minutes. The method may include measuring current and voltage between the first contact and the second contact. The method may include measuring capacitance between the first contact and the second contact. The method may include calculating the depletion width of a p-n junction within the module based on the measured capacitance.

A new in-process electrical connector 100 is shown in FIG. 1. The electrical connector 100 may be positioned near an assembly line and may move into contact with the module as the module passes on a conveyor system. By doing so, the electrical connector 100 can apply a bias to the photovoltaic module. Alternatively, electrical connector 100 can collect, determine, and record performance characteristics of the module during the manufacturing process. The electrical connector 100 may be repositioned manually or automatically to make contact with the passing module.

Figure 2:
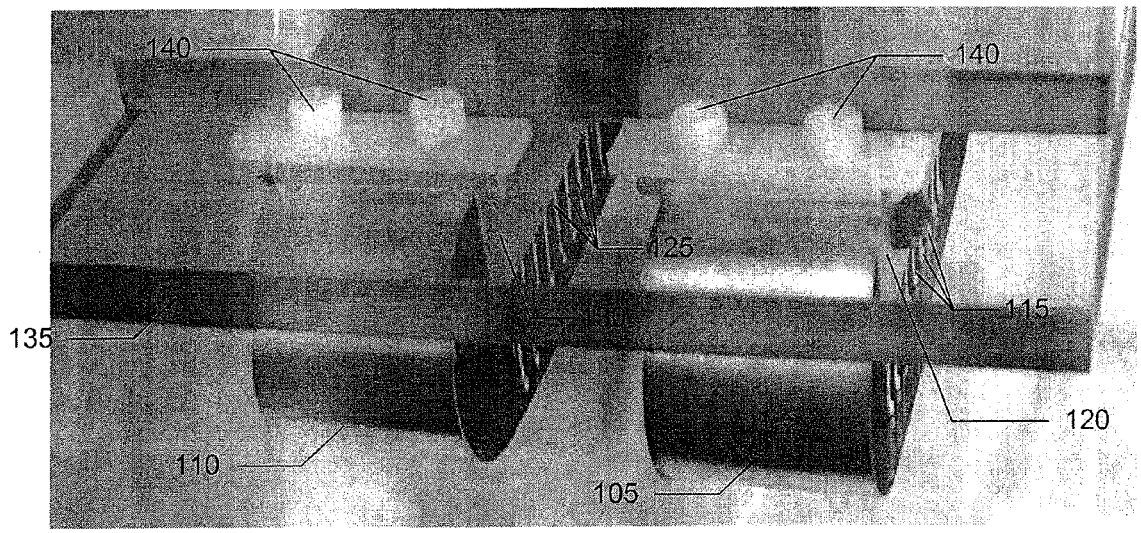
FIG. 2 is a perspective view of an electrical connection apparatus for a photovoltaic module.

To facilitate contact between the electrical connector 100 and the module, the connection apparatus may include a first contact 105 and a second contact 110 (one or both of which can form a temporary contact with the photovoltaic module) as shown in FIGS. 1 and 2. The first contact 105 may be configured to make contact with a first lead on the photovoltaic module to form an electrical connection. Similarly, the second contact 110 may be configured to make contact with a second lead on the photovoltaic module to form an electrical connection. For example, the first contact 105 may contact a positive lead on the module, and the second contact 110 may contact a negative lead on the module, thereby establishing an electrical circuit.

Figure 3:
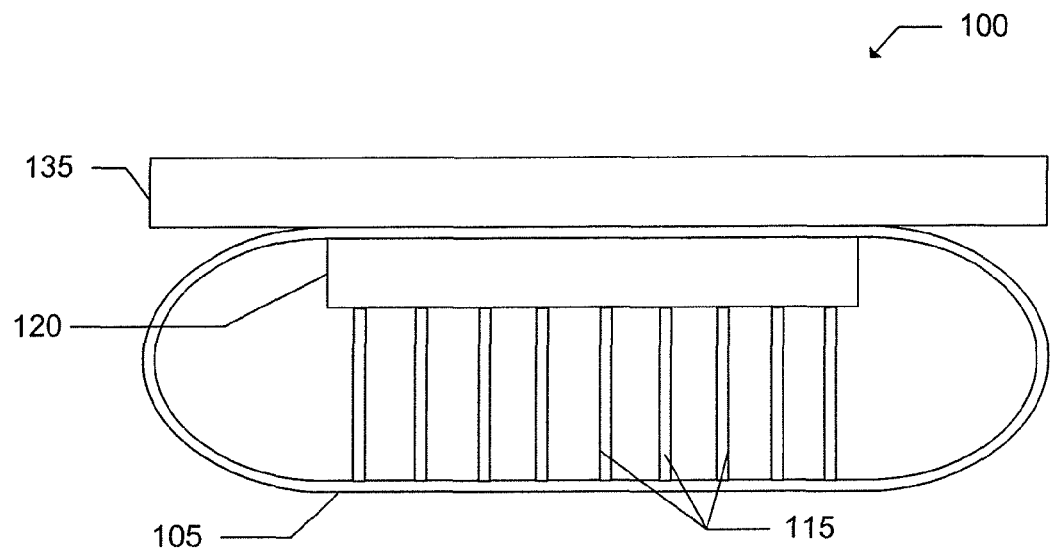
FIG. 3 is a side view of an electrical connection apparatus for a photovoltaic module.
Figure 4:
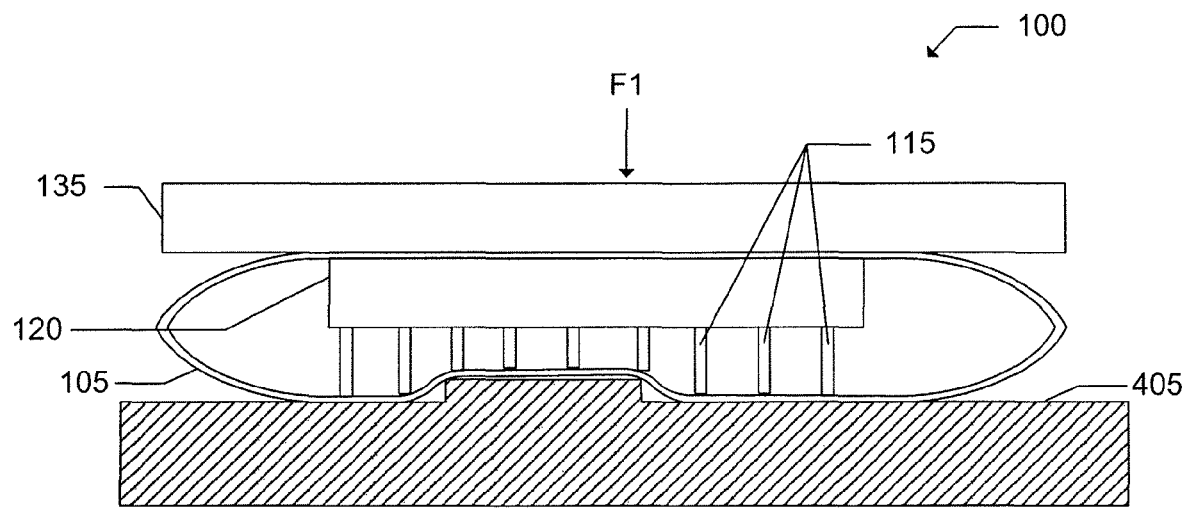
FIG. 4 is a side view of an electrical connection apparatus for a photovoltaic module.

FIGS. 3 and 4 depict a side view of one embodiment. As shown in FIG. 4, the first contact 105 and the second contact 110 may be deformable. In particular, when the first and second contact (105, 110) are pressed against a surface, the first and second contacts may conform to the shape of the surface. For example, the first and second contacts (105, 110) may conform to a flat surface, a curved surface, or a surface having raised features. By permitting the first and second contacts to deform, the electrical connector 100 may achieve better electrical contact with the module resulting in improved test results. The first and second contacts (105, 110) may be flexible metal strips formed into hoops as shown in FIGS. 1-6.

In one embodiment shown in FIG. 3, the first and second contacts (105, 110) may be metal foil. A first plurality of compressible adjustable contacts 115 may be inserted into a first conductive block 120. The adjustable contacts 115 may be any suitable adjustable contacts such as, for example, spring-loaded contacts (spring contacts), self-adjusting contacts, coiled springs, or telescoping contacts. For example, the first conductive block 120 may have a plurality of holes, where each hole has a suitable diameter to receive a single adjustable contact from the plurality of adjustable contacts 115. The first conductive block 120 may be mounted to an insulating layer 135 using a plurality of insulating fasteners 140. The insulating layer 135 may provide a point of integration between the connection apparatus and the assembly line. The insulating layer 135 may include polycarbonate, and the insulating fasteners 140 may include Teflon, although any suitable insulating materials can be used.

The first adjustable contacts 115 may extend from the conductive block 120 to contact a side opposite the first contact 105. Similarly, a second plurality of compressible adjustable contacts 125 may be inserted into a second conductive block 130 and may extend to the second contact 110. The first and second pluralities of adjustable contacts (115, 125) may resist deformation of the first and second contacts (105, 110) when a force F1 is applied against the respective contacts (105, 110). For example, if the electrical connector is lowered onto the photovoltaic module to a height where the first contact 105 is deformed, the first plurality of adjustable contacts 115 may resist that deformation. In resisting the deformation, the first plurality of adjustable contacts 115 may apply an opposing force against a back surface of the first contact 105, thereby ensuring an excellent electrical contact between the module and the first surface. The second plurality of adjustable contacts 125 may function in a similar manner.

Figure 5:
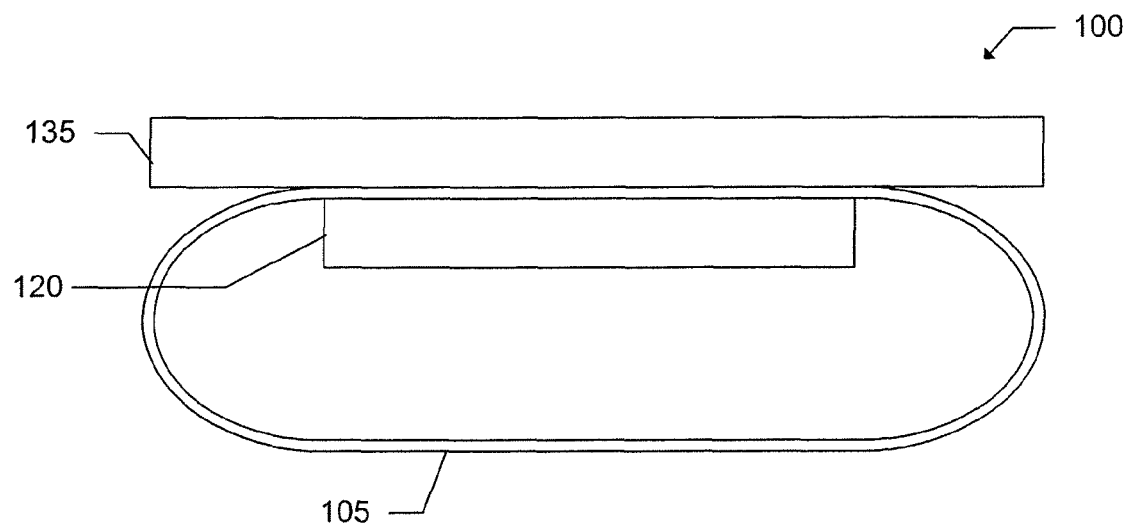
FIG. 5 is a side view of an electrical connection apparatus for a photovoltaic module.
Figure 6:
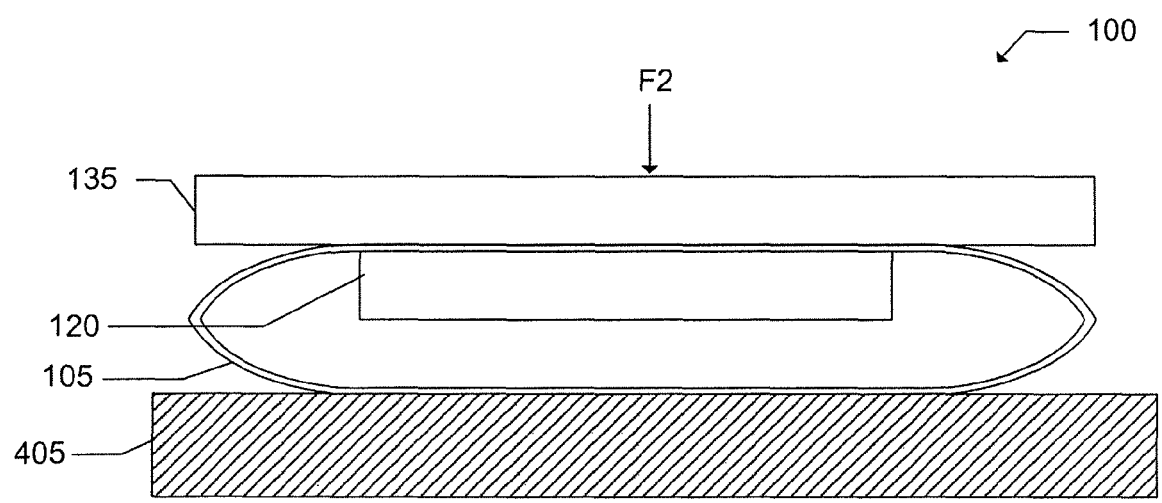
FIG. 6 is a side view of an electrical connection apparatus for a photovoltaic module.

In another embodiment, metallic strips used to construct the first and second contacts (105, 110) may have sufficient thickness to behave as springs. As shown in FIG. 5, there is no need for a first or second plurality of adjustable contacts (115, 125) in this embodiment. Each metallic strip deforms when a force F2 is applied against it as shown in FIG. 6. When the force is removed, the metallic strip returns to its original shape as shown in FIG. 5.

Figure 7:
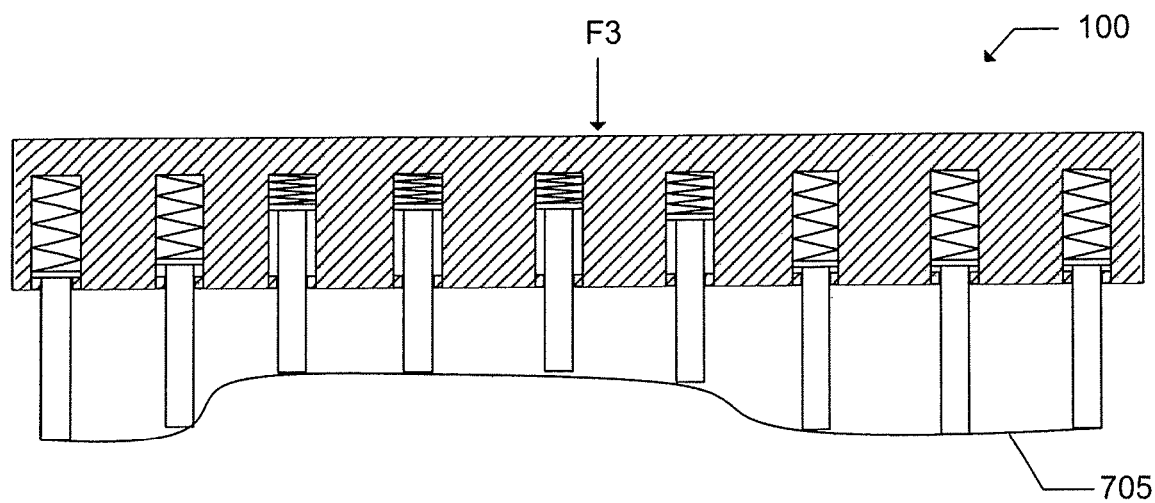
FIG. 7 is a cross-sectional view of a plurality of adjustable contacts for a connection apparatus.
Figure 8:
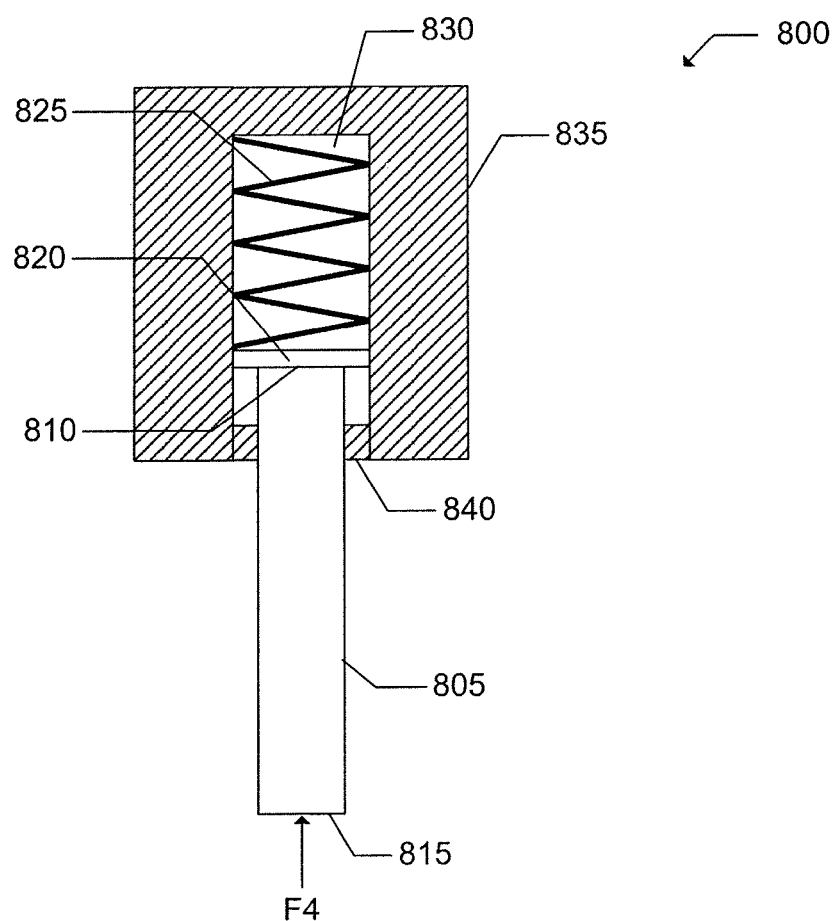
FIG. 8 is a cross-sectional view of an individual adjustable contact for a connection apparatus.

The first and second pluralities of adjustable contacts (115, 125) may be particularly useful when the module has an uneven surface 405 as shown in FIG. 4. The first and second plurality of adjustable contacts (115, 125) may allow the first and second contacts (105, 110) to contour to the uneven surface 405 of the module. For example, some of the adjustable contacts may compress into their respective conductive blocks (120, 130). FIG. 7 depicts a cross-sectional view of the electrical connector 100 and demonstrates how the plurality of springs (e.g. 115, 125) react when pressed against an uneven surface 705. FIG. 8 shows a cross-sectional view of an individual adjustable contact 800. The adjustable contact 800 may include a contact member 805 having a top end 810 and a bottom end 815. A spring retainer 820 may be mounted to the top end 810 of the contact member 805. The bottom end 815 of the contact member may be configured to press against the back surface of the first contact, thereby forming an electrical pathway. A spring 825 may be disposed within a recess 830 formed between the spring retainer 820 and the conductive block 835. The spring 825 may be constructed from conductive material allowing it to serve as an electrical pathway. As the contact member 805 is pushed into the recess 830 by a force F4, the spring retainer 820 may transmit the force F4 to the spring 825, thereby compressing the spring. To prevent the contact member 805 from exiting the recess 830 when the force F4 is not present, a retainer may be installed. For example, a retainer 840 may be threaded into the entrance of the recess 830, thereby capturing the contact member 805 within the recess.

Figure 10:
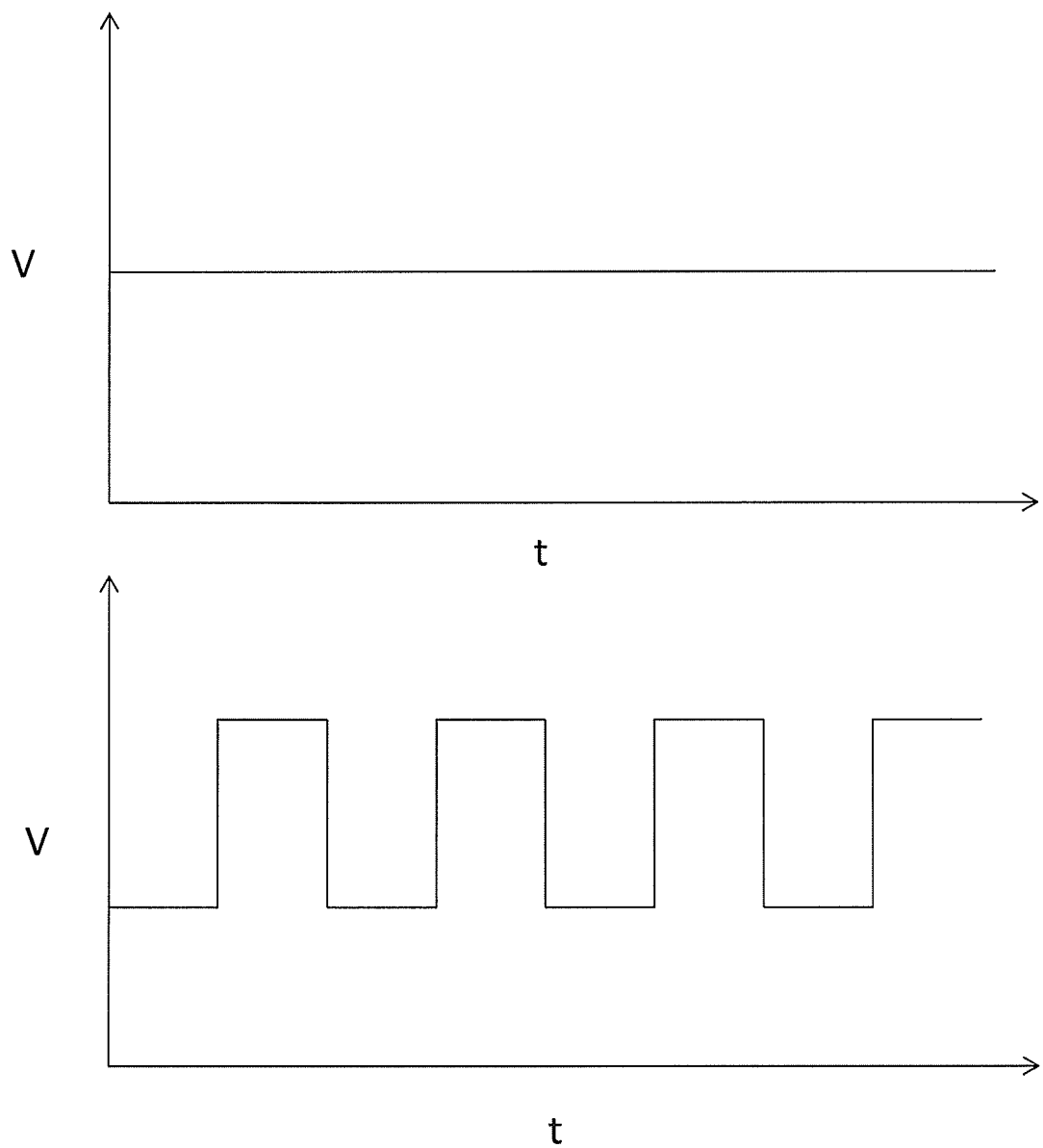
FIG. 10 is a Voltage graph of an applied electrical bias according to an embodiment of the invention.
Figure 11:
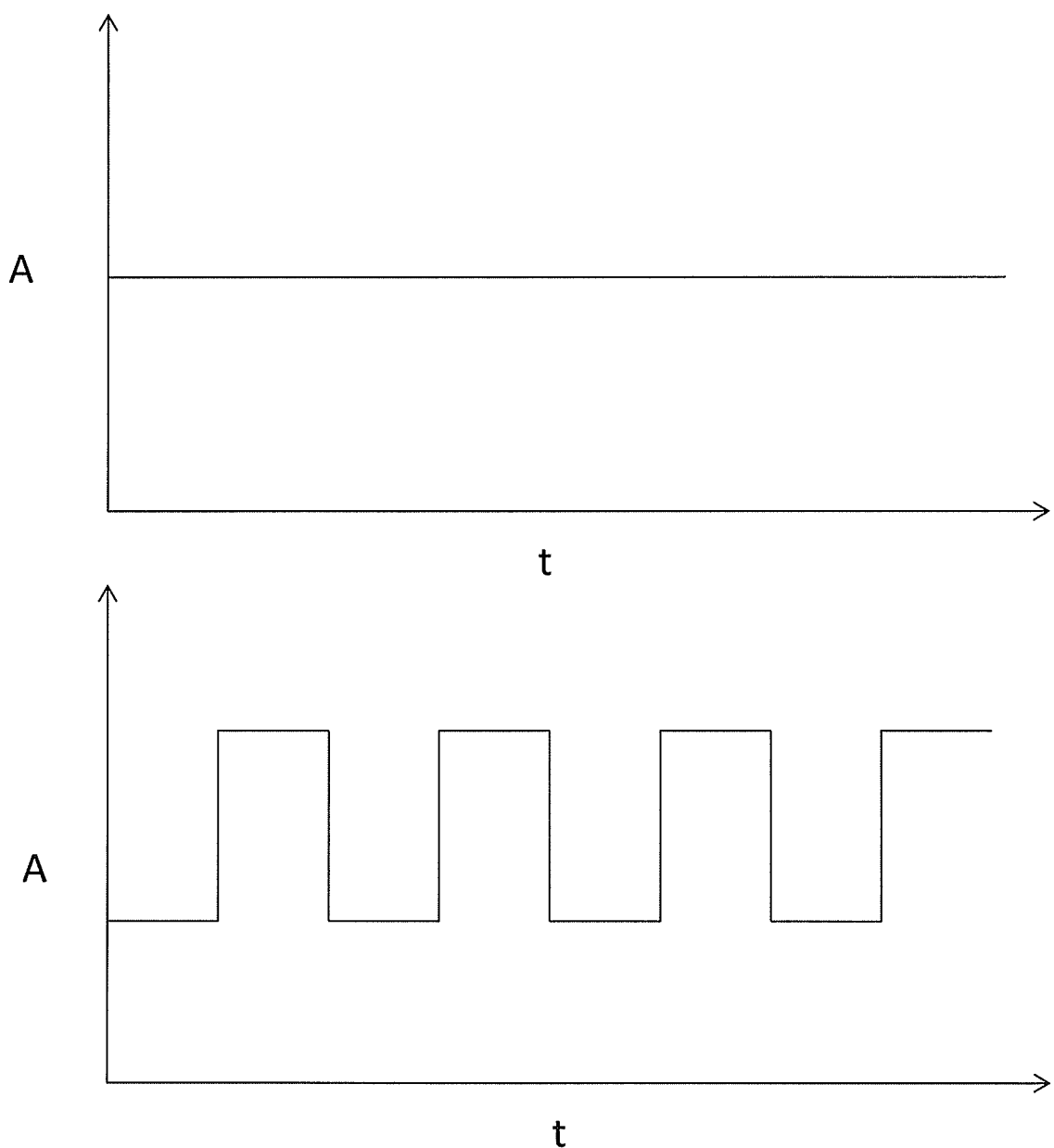
FIG. 11 is a current graph of an applied electrical bias according to an embodiment of the invention.

The electrical connector 100 may include a power source capable of acting as a current source or a voltage source. The power source may be connected to the first and second conductive blocks (120, 130). For example, a first wire 145 may be connected to the first conductive block 120, and a second wire 150 may be connected to the second conductive block 130. The electrical connector 100 may be capable of providing a wide variety of outputs across the first and second wires (145, 150). For instance, as shown in FIGS. 10 and 11, the power source may provide alternating current at selectable frequencies, constant voltage, pulsed voltage, constant current, pulsed current, voltage sweeps with selectable sweep rates, or a combination thereof. The power source may provide voltages ranging from 5 mV to 300 V and currents ranging from 0.1 Amps to 30 Amps. The power source may provide alternating current having a frequency ranging from 0 Hz to 100 MHz. Preferably, the power source may provide alternating current ranging from 1 kHz to 200 kHz. Alternately, the power source may provide direct current. The electrical bias may be applied to the partially assembled photovoltaic module for any suitable duraction, for example, a duration of about 1 ms to about 30 minutes, or about 1 ms to about 20 minutes, or about 1 ms to about 10 min, or about 1 ms to about 5 minutes, or about 1 ms to about 1 minute, or about 1 ms to about 15 seconds, or about 1 ms to about 5 seconds, or about 20 minutes to about 30 minutes, or about 10 minutes to about 20 minutes, or about 5 minutes to about 15 minutes.

The electrical connector 100 may include a current-voltage measuring device or any other suitable metrological apparatus or device. The current-voltage measuring device may be used in combination with the power source to provide pulsed current-voltage testing, which is a method for evaluating the performance and reliability of a module containing a semiconductor. Pulsed current-voltage test methodologies may include sweeps or single-pulse testing. The electrical connector 100 may include a capacitance-measuring device. The capacitance-measuring device may be integrated into the electrical connector 100, or it may be a separate device. The capacitance-measuring device can measure capacitance between the first wire 145 and the second wire 150 or between any other two points in the circuit. To measure capacitance of the semiconductor within the module, the electrical connector 100 may charge and discharge the module with a known current. By measuring the rate of rise of the resulting voltage, the capacitance can be calculated. A slower rate of voltage rise is indicative of a larger capacitance, whereas a faster rate of voltage rise is indicative of a smaller capacitance. The electrical connector 100 may be connected to a digital display that presents relevant values (such as capacitance values) during testing. The values shown on the display may be used to identify non-conforming modules. If a non-conforming module is identified, a manual or automated system may be used to remove non-conforming modules from the assembly line. The values may also be transmitted to a computer system where they are stored in a database and used to quantify product quality over time.

Electrical connector 100 can also be configured in capacitance-voltage (C-V) profiling system. C-V profiling can be used to determine characteristics of the p-n junctions in the photovoltaic module. For instance, information about doping density and trap density (i.e. defect density) can be determined by varying the voltage across the device and measuring the resulting capacitance. Determining the doping density provides feedback on how the manufacturing process is functioning. If the doping density is not within a desired range, the process can be corrected before resources are wasted in constructing nonconforming products.

Figure 9:
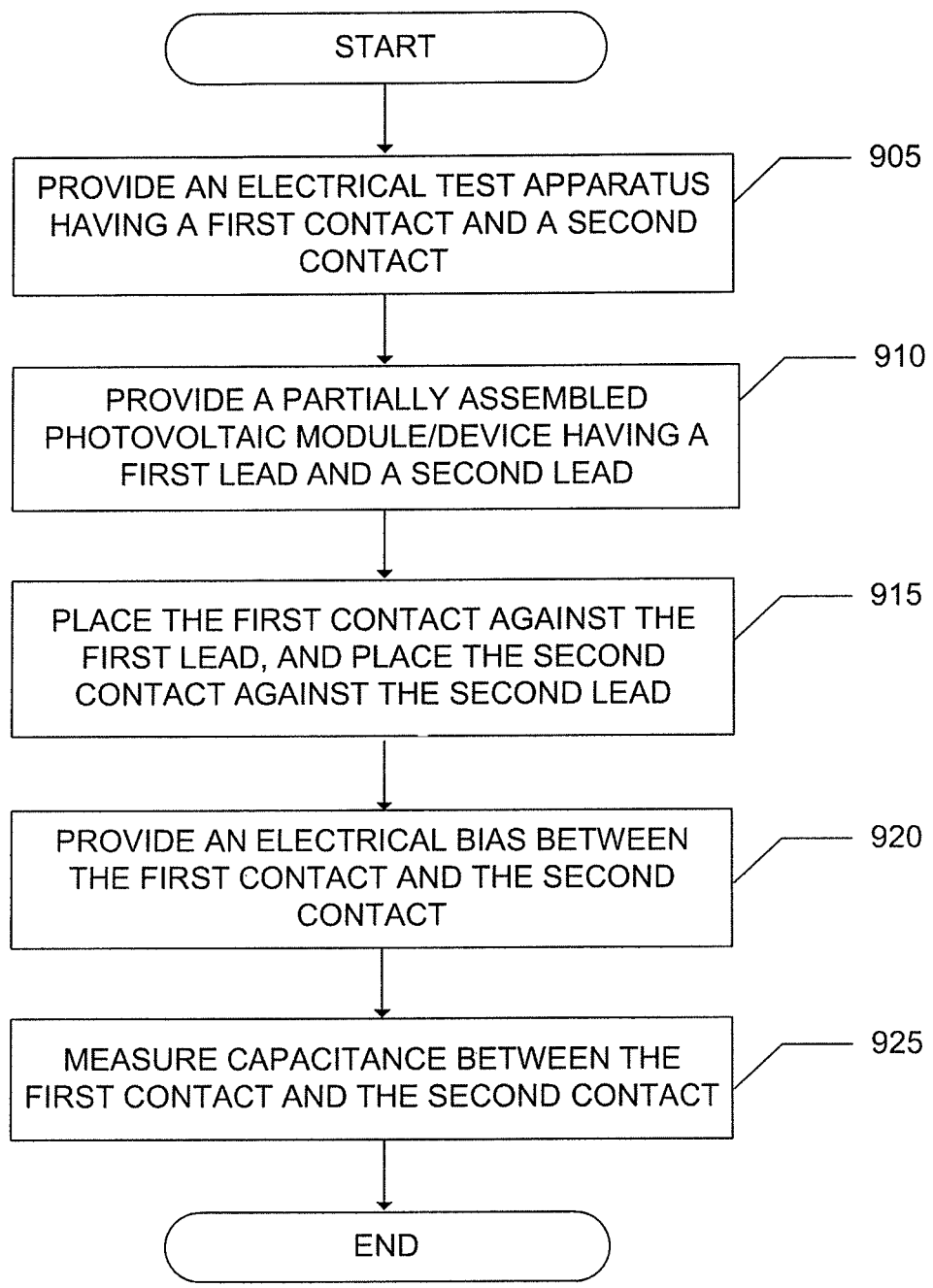
FIG. 9 is a flow chart of a method for assessing performance of a partially assembled photovoltaic module.

FIG. 9 depicts a method for assessing performance of a partially assembled photovoltaic module. In particular, the method includes providing an electrical connection apparatus having a first contact and a second contact 905 and providing a partially assembled photovoltaic module having a first lead and a second lead 910. The first contact is placed against the first lead, and the second contact is placed against the second lead 915. An electrical bias is provided between the first contact and the second contact 920, and the capacitance is measured between the first contact and the second contact 925.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. In particular, steps depicted in figures may be executed in orders differing from the orders depicted. For example, steps may be performed concurrently or in alternate orders from those depicted. It should also be understood that the appended drawings are not necessarily to scale, presenting a somewhat simplified representation of various features and basic principles of the invention.

What is claimed is:

1. An electrical connection apparatus for a photovoltaic module comprising:
   an insulating platform comprising a top side and bottom side;
   a first contact configured to engage a first lead on a photovoltaic module;
   a first conductive block wherein the first contact is attached to the first conductive block,
   the first contact comprising a metal foil loop comprising a first and second portion, wherein the first portion is between the insulating platform and the first conductive block, and the second portion is configured to deform in order to conform to a surface of the first lead;
   a second contact configured to engage a second lead on a photovoltaic module;
   a second conductive block wherein the second contact is attached to the second conductive block,
   the second contact comprising a metal foil loop comprising a first and second portion, wherein the first portion is between the insulating platform and the second conductive block, and the second portion is configured to deform in order to conform to a surface of the second lead; and
   an electrical power source configured to apply an electrical bias between the first contact and the second contact.

2. The apparatus of claim 1, wherein the electrical bias has a voltage ranging from 5 mV to 300 V.

3. The apparatus of claim 2, wherein the electrical bias has a constant voltage.

4. The apparatus of claim 2, wherein the electrical bias has a pulsed voltage.

5. The apparatus of claim 1, wherein the electrical bias has a current ranging from 0.1 Amps to 30 Amps.

6. The apparatus of claim 5, wherein the electrical bias has a constant current.

7. The apparatus of claim 5, wherein the electrical bias has a pulsed current.

8. The apparatus of claim 1, wherein the electrical bias has a frequency ranging from 0 Hz to 100 MHz.

9. The apparatus of claim 1, wherein the first contact includes metal foil, and wherein the second contact includes metal foil.

10. The apparatus of claim 1,
wherein the first conductive block is fastened to the bottom side of the insulating platform; and
the second conductive block is fastened to the bottom side of the insulating platform.

11. The apparatus of claim 10, wherein the first conductive block is fastened to the bottom side of the insulating platform with insulating fasteners; and
wherein the second conductive block is fastened to the bottom side of the insulating platform with insulating fasteners.

12. The apparatus of claim 11, wherein the insulating fasteners comprise a fluorinated polymer.

13. The apparatus of claim 10, further comprising a first plurality of adjustable contacts extending from the first conductive block to the first contact.

14. The apparatus of claim 13, wherein the first plurality of adjustable contacts are spring contacts.

15. The apparatus of claim 13, further comprising a second plurality of adjustable contacts extending from the second conductive block to the second contact.

16. The apparatus of claim 15, wherein the second plurality of adjustable contacts are spring contacts.

17. A method for manufacturing a photovoltaic module comprising:
providing a partially assembled photovoltaic module comprising a surface having at least first and second electrical conductors;
providing an insulating platform comprising a top side and a bottom side;
providing a first conductive block and a first contact, the first contact comprising a metal foil loop comprising a first and second portion, wherein the first portion is between the insulating platform and the first conductive block, and the second portion is deformable;
conforming the first contact to the surface to form a first temporary conductive path between the first contact and the first electrical conductor; and
providing a second conductive block and a second contact, the second contact comprising a metal foil loop comprising a first and second portion, wherein the first portion is between the insulating platform and the second conductive block, and the second portion is deformable;
conforming the second contact to the surface to form a second temporary conductive path between the second contact and the second electrical conductor.

18. The method of claim 17, further comprising applying an electrical bias to at least one photovoltaic device in the partially assembled photovoltaic module via the first and second contacts.

19. The method of claim 18, wherein the bias comprises a preconditioning bias.

20. The method of claim 17, further comprising testing a characteristic of the partially assembled photovoltaic module via the first and second contacts.

21. The method of claim 18, wherein the electrical bias has a voltage ranging from 5 mV to 300 V.

22. The method of claim 21, wherein the electrical bias has a constant voltage.

23. The method of claim 21, wherein the electrical bias has a pulsed voltage.

24. The method of claim 18, wherein the electrical bias has a current ranging from 0.1 Amps to 30 Amps.

25. The apparatus of claim 24, wherein the electrical bias has a constant current.

26. The apparatus of claim 24, wherein the electrical bias has a pulsed current.

27. The method of claim 18, wherein the electrical bias has a frequency ranging from 0 Hz to 100 MHz.

28. The method of claim 18, wherein the electrical bias is applied for a duration of about 1 ms to about 30 minutes.

29. The method of claim 19, further comprising measuring current and voltage between the first contact and the second contact.

30. The method of claim 19, further comprising measuring capacitance between the first contact and the second contact.

31. The method of claim 30, further comprising calculating the depletion width of a p-n junction within the module based on the measured capacitance.

* * * * *